(12) United States Patent
Hirler et al.

(10) Patent No.: US 6,720,616 B2
(45) Date of Patent: Apr. 13, 2004

(54) TRENCH MOS TRANSISTOR

(75) Inventors: Franz Hirler, Isen (DE); Manfred Kotek, Villach (AT); Joost Larik, Poing (DE); Frank Pfirsch, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/027,531

(22) Filed: Dec. 26, 2001

(65) Prior Publication Data

US 2002/0093050 A1 Jul. 18, 2002

Related U.S. Application Data

(63) Continuation of application No. PCT/DE00/01772, filed on May 30, 2000.

(30) Foreign Application Priority Data

Jun. 25, 1999 (DE) .......................................... 199 29 175

(51) Int. Cl.[7] ............................................... H01L 29/78
(52) U.S. Cl. ....................... 257/330; 257/329; 257/331; 257/333; 257/302
(58) Field of Search ................................ 257/328, 331, 257/339, 341, 302, 330, 333, 335, 296

(56) References Cited

U.S. PATENT DOCUMENTS

| | | | | |
|---|---|---|---|---|
| 4,914,058 A | * | 4/1990 | Blanchard | 148/DIG. 126 |
| 4,941,026 A | | 7/1990 | Temple | 357/23.4 |
| 5,072,266 A | | 12/1991 | Bulucea et al. | 357/23.4 |
| 5,424,231 A | * | 6/1995 | Yang | 148/DIG. 126 |
| 5,637,898 A | * | 6/1997 | Baliga | 257/330 |
| 6,262,453 B1 | * | 7/2001 | Hshieh | 257/304 |

FOREIGN PATENT DOCUMENTS

| | | | | |
|---|---|---|---|---|
| JP | 401192175 A | * | 8/1989 | 257/339 |

* cited by examiner

Primary Examiner—Jerome Jackson
Assistant Examiner—Matthew Landau
(74) Attorney, Agent, or Firm—Laurence A. Greenberg; Werner H. Stemer; Gregory L. Mayback

(57) ABSTRACT

A trench MOS-transistor includes a body region strengthened by an implantation area that faces the drain region to increase the avalanche resistance.

9 Claims, 2 Drawing Sheets

TRENCH MOS TRANSISTOR

CROSS-REFERENCE TO RELATED APPLICATION

This application is a continuation of copending International Application No. PCT/DE00/01772, filed May 30, 2000, which designated the United States.

BACKGROUND OF THE INVENTION

Field of the Invention

The invention relates to a trench MOS transistor having a semiconductor body of the first conduction type, in which a trench provided with a gate electrode is provided, which has at least one source zone of the first conduction type in a side area at its upper end and reaches with its lower end into the semiconductor body forming at least one drain zone of the first conduction type, a body region of the second conduction type being provided between source zone and drain zone and the gate electrode being isolated from source zone, body region and drain zone by an insulating layer which has a step, so that the insulating layer has a larger layer thickness toward the lower end of the trench than at the upper end thereof.

In the development of new generations of DMOS power transistors, an important aim is to reduce the on resistivity $R_{on} \cdot A$ (A=effective area). By satisfying such a requirement, it is possible, on one hand, to minimize the static power loss in a DMOS power transistor and, on the other hand, it is thereby possible to achieve higher current densities in the DMOS power transistor. As a result, it is possible to use smaller and less complicated chips for a configuration that processes the same total current.

It is known that the on resistivity $R_{on}$ can be considerably reduced if the planar structure is departed from and a trench structure is employed. The reduction applies, in particular, to integrated configurations, in which trench cells are, therefore, preferably used instead of planar structures. The use of trench cells makes it possible, in particular, to reduce the channel resistance due to a considerable enlargement of the channel width per area.

Using deep trenches can reduce the resistance of the drift path that is preferably located in an epitaxial layer on a semiconductor substrate, the so-called "epi-resistance" (cf., in particular, U.S. Pat. No. 4,941,026 to Temple). However, such deep trenches presuppose a thicker insulating layer in their lower region than in the actual channel region. At the transition between the thicker and the thinner insulating layer, which preferably includes silicon dioxide, an oxide step is present that is unavoidable in deep trenches. At the oxide step, however, during off-state operation of the MOS transistor, there occur considerable spikes of the electric field in the semiconductor body directly below the step. With a small distance between adjacent trenches, these electric field spikes are higher than the values of the electric field in the cell center at the pn junction between source zone and body region. Therefore, avalanche multiplication of charge carriers and injection of hot charge carriers into the gate insulating layer can occur. As a result, the gate insulation layer is damaged and the destruction of the MOS transistor may even be brought about.

Hitherto, the consequences of such a problem, which arises specifically in MOS transistors with deep trenches, have not yet been identified.

SUMMARY OF THE INVENTION

It is accordingly an object of the invention to provide a trench MOS transistor that overcomes the hereinafore-mentioned disadvantages of the heretofore-known devices of this general type and that has deep trenches in which a breakdown at the oxide step in the trench is reliably prevented.

With the foregoing and other objects in view, there is provided, in accordance with the invention, a trench MOS transistor, including a semiconductor body with a first conductivity type, the body forming at least one drain zone with the first conductivity type, the body having a trench with a gate electrode, a trench side area, a trench upper end, and a trench lower end extending into the body, at least one source zone with the first conductivity type, the source zone disposed in the trench side area at the trench upper end and having a source lower end, a first region with a second conductivity type, and a second region with the second conductivity type, the second region buried in the first region, having a higher doping than the first region, and disposed between the source zone and the drain zone, and an insulating layer electrically isolating the gate electrode from the source zone, the first region, and the drain zone. The insulating layer having a step forming a first layer portion having a given thickness at the trench lower end and a second layer portion having a thickness smaller than the given thickness at the trench upper end. The first region is reinforced with the second region toward the drain zone between the trench and an adjacent trench.

Objectives of the invention are achieved by virtue of the fact that the body region is reinforced with a region of the second conduction type toward the drain zone. In order to increase the avalanche strength, the region is doped more highly than the body region.

In accordance with another feature of the invention, the region of the second conduction type, which has the same conduction type as the body region, is provided at the pn junction between the semiconductor body and the body region and has a steeper dopant gradient than the body region.

Thus, the invention's avalanche-resistant trench MOS transistor with a deep trench and an oxide step in the trench is provided with an additional region that is introduced, preferably, by implantation and increases the electric field at the pn junction between body region and semiconductor body so that the breakdown at the pn junction takes place at a lower source-drain voltage of the MOS transistor than the breakdown at the oxide step. In such a case, the semiconductor body is preferably an epitaxial layer made of silicon applied on a semiconductor substrate made of silicon. The additional region may be buried in the body region or reach into the epitaxial layer and increase the doping concentration there in each case between trenches.

In such a case, the trench itself may, in principle, already end in the epitaxial layer of the semiconductor body or reach right into the semiconductor substrate.

Advantageously, in accordance with a further feature of the invention, it is furthermore possible to bevel the step between the insulating layer having a larger layer thickness and the insulating layer having a smaller layer thickness, thereby reducing the electric field at the step.

What is essential to the invention, then, is the introduction of an additional region of the second conduction type between the body region and semiconductor body. The region need not reach below the entire body region and also need not be outdiffused from the surface. By virtue of the additional region, which is introduced, in particular, by implantation, the breakdown voltage is not fixed as in the customary manner (cf., European Patent Application EP 0

746 030 A2, corresponding to U.S. Pat. No. 5,998,836 to Williams, U.S. Pat. No. 5,998,837 to Williams, U.S. Pat. No. 6,204,533 to Williams et al., U.S. Pat. No. 6,049,108 to Williams et al., and U.S. Pat. No. 6,140,678 to Grabowski et al.) by a smaller distance between additional doping and substrate compared with the distance between trench bottom and substrate, but by a higher doping concentration and by inclusion of the effect of the deep trenches that models the electric field. As an advantage of the invention, note is made that the additional region with the higher doping need not reach to a point below the trenches.

In accordance with an added feature of the invention, the additional region that reinforces the body region and is introduced, preferably, by ion implantation can be provided between two trenches by phototechnology and annealed, so that the doping in the actual channel region is not altered. In accordance with an additional feature of the invention, a practical embodiment may be implemented, for example, by square cells or in strip form.

Furthermore, in accordance with yet another feature of the invention, it is also possible for the additional region that reinforces the body region to be introduced in strips perpendicular to the trenches or any other desired geometric forms by implantation, for example, and annealed, so that the doping in the channel region is increased and such part of the MOS transistor no longer contributes to the channel current.

In accordance with yet a further feature of the invention, the second region is disposed at a distance between the trench and the adjacent trench and the second region is parallel to the trench and the adjacent trench.

In accordance with yet an added feature of the invention, the region runs perpendicular to the trenches.

In accordance with yet an additional feature of the invention, the region has a charge carrier concentration of between $10^{17}$ to $10^{19}$ charge carriers/cm$^3$.

In accordance with again another feature of the invention, the body has a semiconductor substrate and an epitaxial layer on the substrate, and the trench extends into the epitaxial layer.

In accordance with again a further feature of the invention, the epitaxial layer and the substrate have a junction therebetween and the trench ends in a vicinity of the junction.

In accordance with again an added feature of the invention, the first conductivity type is a p-conductivity type.

With the objects of the invention in view, there is also provided a trench MOS transistor configuration, including a semiconductor body with a first conductivity type, the body forming at least one drain zone with the first conductivity type, the body having trenches each having a gate electrode, a trench side area, a trench upper end, and a trench lower end extending into the body, at least one source zone with the first conductivity type, the source zone disposed in the trench side area at the trench upper end and having a source lower end, at least one first region with a second conductivity type, at least one second region with the second conductivity type, the second region buried in the first region, having a higher doping than the first region, and disposed between the source zone and the drain zone, at least one insulating layer electrically isolating the gate electrode from the source zone, the first region, and the drain zone, the insulating layer having a step forming a first layer portion having a given thickness at the trench lower end and a second layer portion having a thickness smaller than the given thickness at the trench upper end, and the first region reinforced with the second region toward the drain zone between one of the trenches and an adjacent other one of the trenches.

Other features that are considered as characteristic for the invention are set forth in the appended claims.

Although the invention is illustrated and described herein as embodied in a trench MOS transistor, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
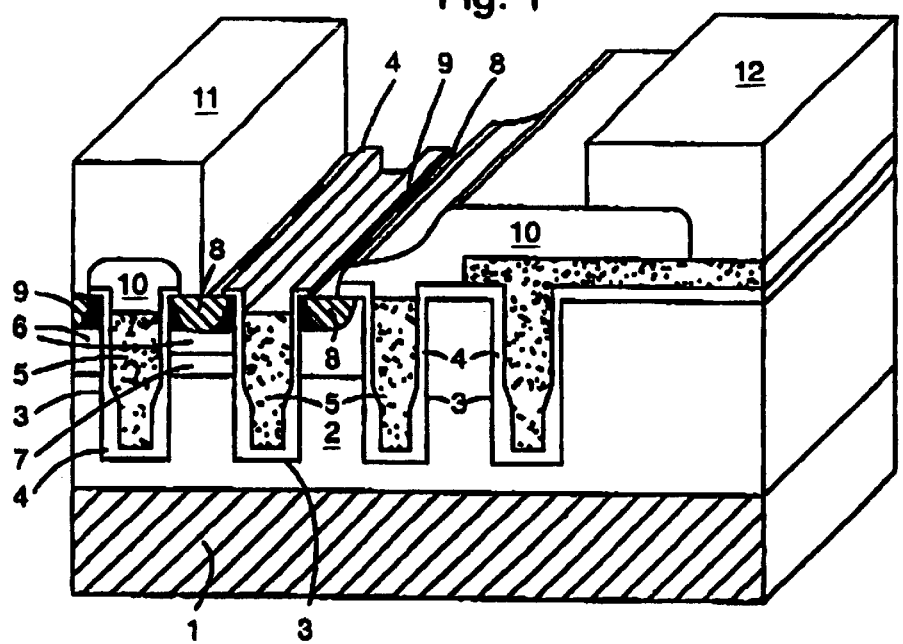
FIG. 1 is a perspective view of a cross-section of an exemplary embodiment of the trench MOS transistor according to the invention.

Referring now to the figures of the drawings in detail and first, particularly to FIG. 1 thereof, there is shown a perspective view of the trench MOS transistor according to the invention. The transistor has a p$^+$-conducting silicon semiconductor substrate 1 on which a p-conducting epitaxial layer 2 made of silicon is applied. A plurality of trenches 3 is provided in the p-conducting epitaxial layer 2. The walls and bottoms of the trenches 3 are coated with an insulating layer 4 made of silicon dioxide. Instead of silicon dioxide, it is also possible to provide other materials, such as, for example, silicon nitride or films made of silicon dioxide and silicon nitride. There is a step 20 in the insulating layer 4 (see FIGS. 2 and 3) because the insulating layer 4 is thicker in a lower part of the trenches 3 than in an upper region thereof. The step 20 is caused by the fact that the trenches 3 are made deep in order to reduce the resistance of the drift path, the so-called "epi-resistance". For such a deep configuration of the trenches 3, however, a thick insulating layer, that is to say a thicker silicon dioxide, must be provided in the lower region of the trenches 3.

The trenches constructed with the insulating layer 4 are filled with polycrystalline silicon 5, which may be doped, if appropriate. An n-conducting body region 6, which is equipped with body contacts 8 and in which source zones 9 extend, is provided in the upper region of the epitaxial layer 2.

Moreover, FIG. 1 shows an insulating layer 10 made of borophosphorus silicate glass, for example, which, in particular, isolates a gate electrode 12 from a source electrode 11 that contact-connects the body contact 8 and the source zone 9. The electrodes 11, 12 may be aluminum, for example.

In the MOS transistor, the current flows through the body region 6, which forms a channel zone, from the source zone 9 to the epitaxial layer 2 and to the p+-conducting substrate 1, which together represent a drain zone. The current flow is controlled by the voltage applied to the gate electrode 12 and, thus, to the polycrystalline silicon 5.

In a MOS transistor, as has been explained above, electric field spikes occur in the silicon at the step 20, that is to say, the transition from the thin oxide to the thick oxide of the insulating layer 4 with an oxide edge 15 in the trench 3. The feature can be seen in FIG. 2, which shows electrical equipotential lines 13 together with a region 14 in which, preferably, avalanche breakdowns can be recorded. This is because, with an excessively small distance between the adjacent trenches 3, these field spikes are higher than the electric field in the cell center at the pn junction between the body region 6 and the epitaxial layer 2, so that avalanche multiplication and injection of hot charge carriers into the insulating layer 4 occur. As a result, the insulating layer 4 is damaged and the transistor may even be destroyed.

Such problem, which has not been identified hitherto in the case of deep trenches 3 and, thus, has not yet been solved either, is solved by the invention by virtue of the fact that an additional region 7 that is n-conducting and, at the same time, is doped more highly than the body region 6 is provided, in particular, by ion implantation. The configuration increases the electric field at the pn junction between the body region 6 and the epitaxial layer 2, so that the breakdown preferably takes place at the pn junction at a lower source-drain voltage than the breakdown at the step 20. It is expedient if the transition between the thinner and thicker parts of the insulating layer 4 is beveled. In other words, the step 20 is expediently configured in an inclined manner, as also can be seen from FIG. 1.

The region 7 is expediently introduced by ion implantation. It goes without saying, however, that it is also possible, if appropriate, to use other methods for producing the region 7. Preferably, the regions 7 have a steeper dopant gradient than the body region 6.

Figure 2:
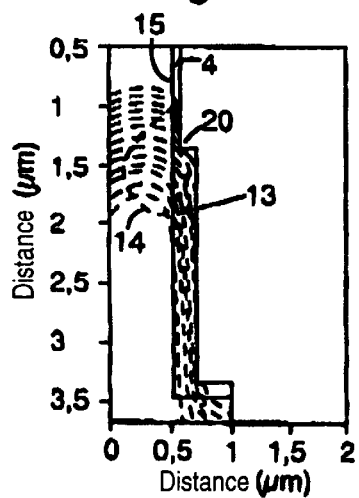
FIG. 2 is a cross-sectional view of half a transistor cell of FIG. 1 without body reinforcement implantation.
Figure 3:
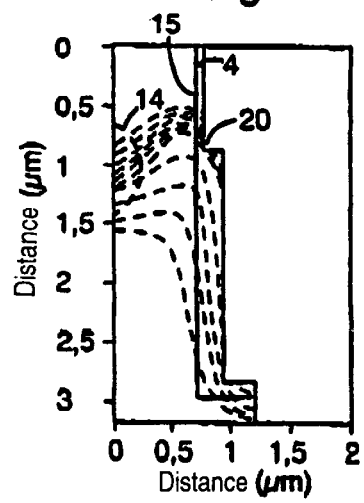
FIG. 3 is a cross-sectional-view of half a transistor cell of FIG. 1 with body reinforcement implantation between respective trenches.

FIG. 3 shows the profile of the electric field with the equipotential lines 13 similar to FIG. 2, although, in FIG. 3, a breakdown no longer takes-place at the step 20. Rather, the region 14 in which a breakdown is preferably to be observed is shifted to within the body region in which the current preferably flows in the event of an avalanche. Simply put, the breakdown no longer takes place in the region of the wall of the trench 3.

Figure 4:
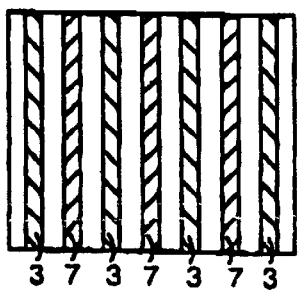
FIG. 4 is a plan view of an alternative strip configuration of trenches and body reinforcement implantations of FIG. 1.
Figure 5:
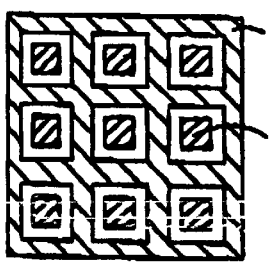
FIG. 5 is a plan view of another transistor cell configuration of FIG. 1.
Figure 6:
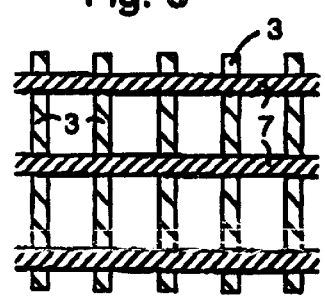
FIG. 6 is a plan view of a third alternative configuration of body reinforcement implantations of FIG. 1 in strips running perpendicularly to trench strips.

FIGS. 4 to 6 show different exemplary embodiments for the configuration of the trenches 3 relative to the additional regions 7.

The regions 7 for body reinforcement can be implanted—aligned by phototechnology—respectively between two trenches 3 and annealed (cf. FIG. 4). As a result, the doping in the channel region is not altered. FIG. 5 shows another possible configuration with square cells of the regions 7 that are disposed between perpendicularly crossing trenches.

A further preferred embodiment is illustrated in FIG. 6, in which the regions 7 run perpendicularly to the trenches 3. In such a case, the regions are implanted and annealed such that the doping in the channel region is increased and this part of the MOS transistor no longer contributes to the channel current.

Thus, the avalanche-resistant MOS transistor according to the invention has the additional region 7, which is preferably introduced by ion implantation and need not reach below the entire "body doping". Moreover, the region 7 need not be outdiffused from the surface. The region 7 clamps the breakdown voltage by virtue of its higher dopant concentration and by inclusion of the field-modeling effect of the deep trenches with the step 20.

Figure 7:
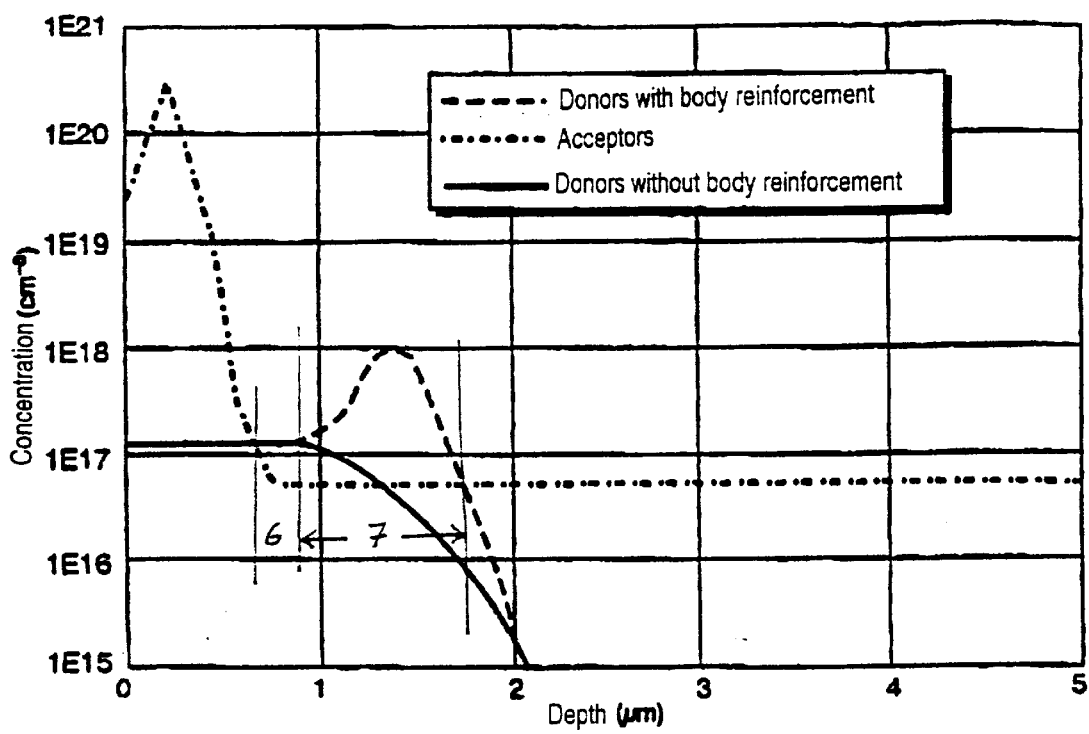
FIG. 7 is a graph illustrating a profile of the doping concentration as a function of the depth for a configuration according to FIG. 6.

FIG. 7 shows the profile of the dopings for a configuration according to FIG. 6. It can clearly be seen here that in the case of the invention ("donors with body reinforcement"), the doping concentration is in the range from about $10^{17}$ to in excess of $10^{18}$ charge carriers cm$^{-3}$ in the region 7, which is distinctly above the customary doping of the body region ("donors without body reinforcement") The results of FIG. 7, which are obtained by simulation, are shown in the regions 7 near the interface thereof with the trenches 3.

Figure 8:
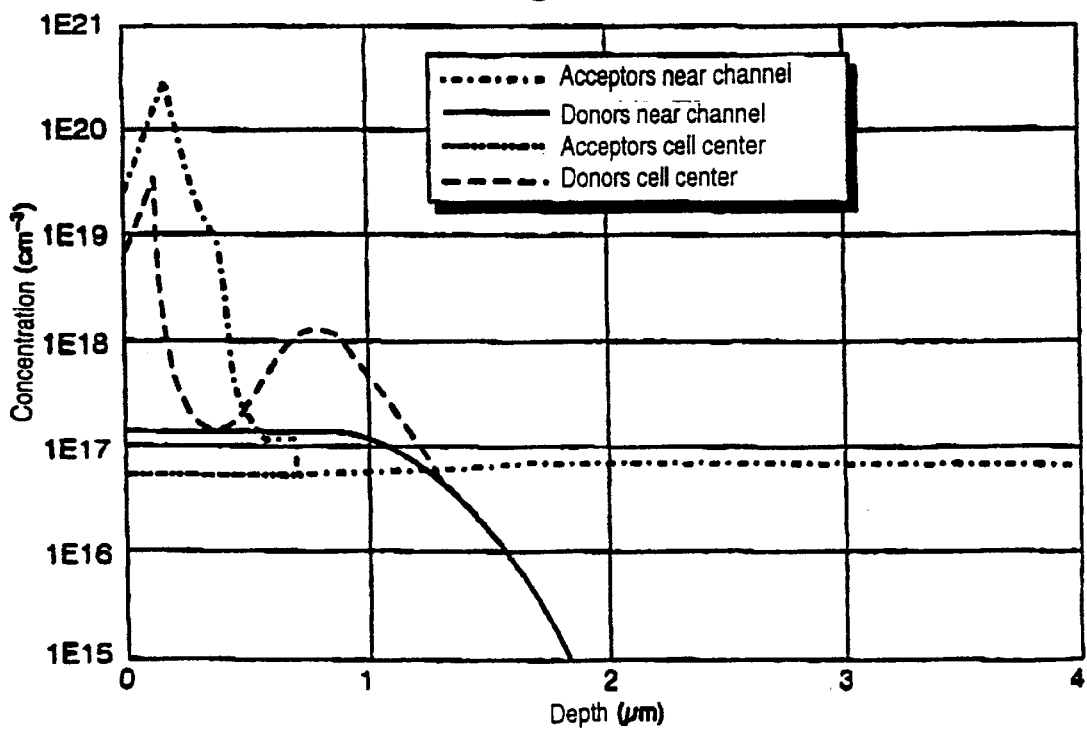
FIG. 8 is a graph illustrating a profile of the doping concentration as a function of the depth for a configuration according to FIG. 4.

FIG. 8 shows an illustration similar to FIG. 7 for a configuration according to FIG. 4, "near channel" denoting a location in the vicinity of the trenches, whereas "cell center" is to be understood as a location in the center of the strip-type region 7. It can be seen from FIG. 8 that the doping concentration in the regions 7 is about $10^{17}$ to $10^{19}$ charge carriers cm$^{-3}$.

The above doping concentrations are only approximate values for the doping in the n-conducting regions 7. It goes without saying that it is also possible to use other values, that is to say, for example, higher than $10^{19}$ charge carriers cm$^{-3}$.

It is also possible for the polarities specified to be interchanged, so that the region 7 is then p-doped with boron, for example.

Finally, in the above exemplary embodiments, the trenches 3 reach as far as the vicinity of the lower end of the p-conducting conducting epitaxial layer 2. However, it is also possible for the trenches 3 to be driven right into the p+-conducting substrate 1.

We claim:

1. A trench MOS transistor, comprising:
    a semiconductor body with a first conductivity type forming at least one drain zone and formed of a semiconductor substrate and an epitaxial layer on said substrate, said epitaxial layer and said substrate having a junction therebetween;
    said semiconductor body having:
        a trench ending in a vicinity of said junction and having:
            a gate electrode;
            a trench side area contacting a side face of said trench;
            a trench upper end; and
            a trench lower end extending into said semiconductor body;
        at least one source zone with said first conductivity type, said source zone:
            disposed in said trench side area at said trench upper end; and
            having a source lower end;
        a first region with a second conductivity type disposed in said trench side area between said trench and an adjacent trench, said first region having a dopant gradient; and a second region with said second conductivity type, said second region:
   buried in said first region in said trench side area;
   having a higher doping and a steeper dopant gradient than said first region;
   disposed between said source zone and said drain zone;
   shaped in a strip; and
   having a charge carrier concentration of between $10^{17}$ to $10^{19}$ charge carriers/cm$^3$;
an insulating layer electrically isolating said gate electrode from said source zone, said first region, and said drain zone; and
said insulating layer having a step forming:
   a first layer portion having a given thickness at said trench lower end; and
   a second layer portion having a thickness smaller than said given thickness at said trench upper end.

2. The trench MOS transistor according to claim 1, wherein said step is beveled.

3. The trench MOS transistor according to claim 1, wherein said second region is ion implanted.

4. The trench MOS transistor according to claim 1, wherein:
   said second region is disposed at a distance between said trench and the adjacent trench; and
   said second region is parallel to said trench and the adjacent trench.

5. The trench MOS transistor according to claim 1, wherein said second region runs perpendicular to said trench.

6. The trench MOS transistor according to claim 1, wherein said second region runs perpendicular to said trench and the adjacent trench.

7. The trench MOS transistor according to claim 1, wherein said trench ends in a vicinity of said junction.

8. The trench MOS transistor according to claim 1, wherein said first conductivity type is a p-conductivity type.

9. A trench MOS transistor configuration, comprising:
   a semiconductor body with a first conductivity type forming at least one drain zone and formed of a semiconductor substrate and an epitaxial layer on said substrate, said epitaxial layer and said substrate having a junction therebetween;
   said semiconductor body having:
      trenches ending in a vicinity of said junction and each having:
         a gate electrode;
         a trench side area contacting a side face of said trench;
         a trench upper end; and
         a trench lower end extending into said body;
      at least one source zone with said first conductivity type, said source zone:
         disposed in said trench side area at said trench upper end; and
         having a source lower end;
      a first region with a second conductivity type disposed in said trench side area between said trench and an adjacent trench, said first region having a dopant gradient; and
      a second region with said second conductivity type, said second region:
         buried in said first region in said trench side area;
         having a higher doping and a steeper dopant gradient than said first region;
         disposed between said source zone and said drain zone;
         shaped in a strip; and
         having a charge carrier concentration of between $10^{17}$ to $10^{19}$ charge carriers/cm$^3$;
   at least one insulating layer electrically isolating said gate electrode from said source zone, said first region, and said drain zone; and
   said insulating layer having a step forming:
      a first layer portion having a given thickness at said trench lower end; and
      a second layer portion having a thickness smaller than said given thickness at said trench upper end.

* * * * *